(12) United States Patent
Choi et al.

(10) Patent No.: US 9,696,582 B2
(45) Date of Patent: Jul. 4, 2017

(54) ARRAY SUBSTRATE, METHOD FOR MANUFACTURING THE SAME, LIQUID CRYSTAL DISPLAY PANEL

(71) Applicant: BOE Technology Group Co., Ltd., Beijing (CN)

(72) Inventors: Hyun Sic Choi, Beijing (CN); Hui Li, Beijing (CN); Zheng Fang, Beijing (CN); Haiyan Wang, Beijing (CN); Yunyun Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/418,750

(22) PCT Filed: Mar. 31, 2014

(86) PCT No.: PCT/CN2014/074422
§ 371 (c)(1),
(2) Date: Nov. 12, 2015

(87) PCT Pub. No.: WO2015/123914
PCT Pub. Date: Aug. 27, 2015

(65) Prior Publication Data
US 2016/0077378 A1    Mar. 17, 2016

(30) Foreign Application Priority Data
Feb. 18, 2014   (CN) .......................... 2014 1 0055293

(51) Int. Cl.
*G02F 1/1335*    (2006.01)
*G02F 1/1368*    (2006.01)
(Continued)

(52) U.S. Cl.
CPC ...... *G02F 1/133555* (2013.01); *G02F 1/1368* (2013.01); *G02F 1/13439* (2013.01);
(Continued)

(58) Field of Classification Search
CPC ........... G02F 1/33555; G02F 1/133345; G02F 1/133514; G02F 1/133553; G02F 1/13439;
(Continued)

(56) References Cited

U.S. PATENT DOCUMENTS 6,466,280 B1 * 10/2002 Park ................. G02F 1/133555
349/113
2007/0103625 A1    5/2007 Masutani et al.
(Continued)

FOREIGN PATENT DOCUMENTS

CN        1959993 A      5/2004
CN        1553248 A      12/2004
(Continued)

OTHER PUBLICATIONS

First Office Action, including Search Report, for Chinese Patent Application No. 201410055293.3, dated Dec. 24, 2015, 15 pages.
(Continued)

*Primary Examiner* — James Dudek
(74) *Attorney, Agent, or Firm* — Westman, Champlin & Koehler, P.A.

(57) ABSTRACT

The present invention provides an array substrate, a method for manufacturing the same, and a liquid crystal display panel. The array substrate includes a plurality of pixel units arranged in an array, each pixel unit comprising a reflection region and a transmission region, and for any pixel unit, the array substrate comprising a substrate; a thin film transistor provided on the substrate; and a reflection electrode and a first transparent electrode which are electrically connected with each other, the reflection electrode being located in the reflection region, and the first transparent electrode being located in the transmission region, wherein a first transparent insulation layer is provided between the reflection elec-
(Continued)

trode and the first transparent electrode, and the reflection electrode is on a side of the first transparent insulation layer which is closer to the substrate.

17 Claims, 5 Drawing Sheets

(51) Int. Cl.
*H01L 27/12* (2006.01)
*G02F 1/1333* (2006.01)
*G02F 1/1362* (2006.01)
*G02F 1/1343* (2006.01)

(52) U.S. Cl.
CPC .. *G02F 1/133345* (2013.01); *G02F 1/133514* (2013.01); *G02F 1/133553* (2013.01); *G02F 1/136227* (2013.01); *H01L 27/12* (2013.01); *H01L 27/1214* (2013.01); *H01L 27/1259* (2013.01); *G02F 2001/134318* (2013.01); *G02F 2001/134372* (2013.01)

(58) Field of Classification Search
CPC . G02F 1/136227; G02F 1/1368; H01L 27/12; H01L 27/1214; H01L 27/1259
See application file for complete search history.

(56) References Cited

U.S. PATENT DOCUMENTS

| | | | | |
|---|---|---|---|---|
| 2008/0204636 | A1* | 8/2008 | Ge | G02F 1/133345 349/114 |
| 2009/0262286 | A1* | 10/2009 | Nishida | G02F 1/133555 349/114 |
| 2011/0143285 | A1* | 6/2011 | Lim | G02F 1/133555 430/316 |

FOREIGN PATENT DOCUMENTS

| | | |
|---|---|---|
| CN | 1896857 A | 1/2007 |
| CN | 101075045 A | 11/2007 |
| CN | 101097362 A | 1/2008 |
| CN | 203720494 U | 7/2014 |
| KR | 10-2009-0051981 A | 5/2009 |

OTHER PUBLICATIONS

English translation of Box No. V of the Written Opinion for the International Searching Authority for International Application No. PCT/CN2014/074422, 2 pages.
International Search Report and Written Opinion (in Chinese) for PCT Application No. PCT/CN2014/074422, dated Nov. 13, 2014, 12 pages.

* cited by examiner

| | bright state (power on) | dark state (power off) |
|---|---|---|
| result | bright state | dark state |
| output light | ⬆ | ⬆ |
| upper polarizer (90°) | ↕ | — |
| phase delay of upper polarizer ($\lambda/4$) | ↕ | ↔ |
| phase delay of liquid crystal layer ($\lambda/2$) | ↻ | ↻ |
| phase delay of lower polarizer ($\lambda/4$) | ○ | ⬆ |
| lower polarizer (0°) | ↔ | |
| input light | ✴ | |

FIG.9

| | bright state (power on) | dark state (power off) |
|---|---|---|
| result | bright state | dark state |
| input light | | |
| upper polarizer (90°) | | |
| phase delay of upper polarizer (λ/4) | | |
| phase delay of liquid crystal layer (λ/2) | | |
| reflection electrode | | |

ARRAY SUBSTRATE, METHOD FOR MANUFACTURING THE SAME, LIQUID CRYSTAL DISPLAY PANEL

CROSS-REFERENCE TO RELATED APPLICATION

This application is a Section 371 National Stage Application of International Application No. PCT/CN2014/074422, filed 31 Mar. 2014, which has not yet published, which claims priority to Chinese Patent Application No. 201410055293.3, filed 18 Feb. 2014, in Chinese, the contents of which are hereby incorporated by reference in their entirety.

BACKGROUND OF THE INVENTION

Field of the Invention

The present invention relates to a technical field of display, more particularly, relates to an array substrate, a method for manufacturing the same, and a liquid crystal display (LCD) panel.

Description of the Related Art

A transflective LCD device comprises, in a display area forming a LCD panel thereof, a transmission region and a reflection region, wherein the transmission region controls the transmission amount of light coming from a back light source to achieve a transmission-type display, and the reflection region controls the reflection amount of ambient light to achieve a reflection-type display. That is, the transflective LCD device mainly performs transmission-type display in a dim environment, and mainly performs reflection-type display in a bright environment, so as to ensure visibility of displayed images.

In designing the transflective LCD device, phase delay R of the transmission region needs to be two times of that of the reflection region. For example, the phase delay of the transmission region may be set as $\lambda/2$, while the phase delay of the reflection region is set as $\lambda/4$, wherein $\lambda$ is the wavelength of light contributing to displaying.

In the prior art, the transflective display is achieved mainly by controlling the thicknesses d of the transmission region and the reflection region, that is, by controlling the thickness of the liquid crystal layer of the transmission layer to be two times of that of the liquid crystal layer of the reflection region.

SUMMARY OF THE INVENTION

An array substrate, comprising: a plurality of pixel units arranged in an array, each pixel unit comprising a reflection region and a transmission region, and for any pixel unit, the array substrate comprising a substrate; a thin film transistor provided on the substrate; and a reflection electrode and a first transparent electrode which are electrically connected with each other, the reflection electrode being located in the reflection region, and the first transparent electrode being located in the transmission region, wherein a first transparent insulation layer is provided between the reflection electrode and the first transparent electrode, and the reflection electrode is on a side of the first transparent insulation layer which is closer to the substrate.

A liquid crystal display panel, comprising: an array substrate and a color filter substrate which are celled together; and a liquid crystal layer located between the array substrate and the color filter substrate, wherein the array substrate comprises a plurality of pixel units arranged in an array, each pixel unit comprising a reflection region and a transmission region, and for any pixel unit, the array substrate comprises a substrate; a thin film transistor provided on the substrate; and a reflection electrode and a first transparent electrode which are electrically connected with each other, the reflection electrode being located in the reflection region, and the first transparent electrode being located in the transmission region, wherein a first transparent insulation layer is provided between the reflection electrode and the first transparent electrode, and the reflection electrode is on a side of the first transparent insulation layer which is closer to the substrate.

A method for manufacturing an array substrate, the array substrate comprising a plurality of pixel units arranged in an array, each pixel unit comprising a reflection region and a transmission region, wherein for any pixel unit, the method comprises steps of: forming a thin film transistor on a substrate; forming a reflection electrode in the reflection region; forming a first transparent insulation layer above the reflection electrode; and forming a first transparent electrode above the first transparent insulation layer, wherein the first transparent electrode is electrically connected with the reflection electrode.

BRIEF DESCRIPTION OF THE DRAWINGS

In order to more clearly describe embodiments of the present invention or solutions of the prior art, hereafter, it will simply introduce drawings for describing the embodiments of the present invention or the solutions of the prior art. Obviously, these drawings herein are intended to be illustrated, and not restrictive. For example, many modifications may be made to these drawings by those skilled in this art without departing from the principles and spirit of the disclosure.

LIST OF REFERENCE NUMBERS

10—array substrate; 10a—reflection region; 10b—transmission region; 101—substrate; 102—thin film transistor;

1021—gate electrode; 1022—gate insulation layer; 1023—semi-conductive active layer; 1024—source electrode; 1025—drain electrode; 103—reflection electrode; 104—first transparent electrode; 105—first transparent insulation layer; 106—second transparent insulation layer; 107—adhesion layer; 108—passivation layer; 109—second transparent electrode; 20—color filter substrate; 30—liquid crystal layer; 40—first polarizer; 50—second polarizer.

DETAILED DESCRIPTION OF PREFERRED EMBODIMENTS OF THE INVENTION

The solutions of the embodiments of the present invention will be described clearly and completely with reference to the attached drawings of the embodiments of the present invention. Obviously, the described embodiments are only some of the embodiments of the present invention. Other embodiments obtained, based on the embodiments of the present invention, by those skilled in this art all fall within the scopes of the present invention.

The embodiments of the present invention provide an array substrate 10. As shown in FIGS. 1-4, the array substrate comprises a plurality of pixel units arranged in an array, each pixel unit comprising a reflection region 10a and a transmission region 10b, and for any pixel unit, the array substrate comprises a substrate 101; a thin film transistor 102 provided on the substrate 101; and a reflection electrode 103 and a first transparent electrode 104 which are electrically connected with each other, the reflection electrode 103 being located in the reflection region 10a, and the first transparent electrode 104 being located in the transmission region 10b, wherein a first transparent insulation layer 105, for example, an organic transparent insulation layer, is provided between the reflection electrode 103 and the first transparent electrode 104, and the reflection electrode 104 is on a side of the first transparent insulation layer 105 which is closer to the substrate 101.

When the array substrate 10 is applied to a liquid crystal display panel, the liquid crystal display panel may comprise a second transparent electrode 109. Thus, the reflection region 10a may comprise the reflection electrode 103 and the second transparent electrode 109; the transmission region 10b may comprise the first transparent electrode 104 and the second transparent electrode 109.

According to designing principle of the transflective liquid crystal display panel, the phase delay in the transmission region 10b needs to be two times of the phase delay in the reflection region 10a, that is, $d_1 \times \Delta n_1 = 2 \times d_2 \times \Delta n_2$, wherein $d_1$ is the thickness of the liquid crystal layer in the transmission region 10b, $\Delta n_1$ is the phase delay of the liquid crystals in the transmission region 10b, $d_2$ is the thickness of the liquid crystal layer in the reflection region 10a, $\Delta n_2$ is the phase delay of the liquid crystals in the reflection region 10a.

Thus, in the embodiment of the present invention, in the case that the thickness of the liquid crystal layer in the transmission region 10b is equal to that of the liquid crystal layer in the reflection region 10a, that is, $d_1 = d_2$, the transflective function is achieved by controlling the phase delay of the liquid crystals in the transmission region 10b to be two times of the phase delay of the liquid crystals in the reflection region 10a, that is, $\Delta n_1 = 2\Delta n_2$.

Based on the above, since the phase delay of the liquid crystals is determined by electric field intensity applied to the liquid crystal layer, in order to make the phase delay of the liquid crystals in the transmission region 10b to be two times of the phase delay of the liquid crystals in the reflection region 10a, the electric field intensity between two electrodes of the transmission region 10b needs to be two times of the electric field intensity between two electrodes of the reflection region 10a.

To be specific, there is a relationship between voltage and electric field intensity, that is, $U = \epsilon_0 \epsilon E D$, wherein U is a voltage between two electrodes (the reflection electrode 103 and the second transparent electrode 109, or the first transparent electrode 104 and the second transparent electrode 109), E is the electric field intensity formed between the two electrodes, D is the distance between the two electrodes, $\epsilon_0$ is vacuum permittivity, and $\epsilon$ is the dielectric constant of a dielectric layer between the two electrodes. It can be known from the above that under the same voltage, the electric field intensity depends on the distance between the two electrodes and the dielectric layer between the two electrodes, wherein the electric field intensity is inversely proportional to the product of distance between the two electrodes and the dielectric constant of the dielectric layer between the two electrodes. Therefore, by controlling the distance between the two electrodes and the dielectric layer between the two electrodes, that is, $\epsilon D$, the electric field intensity of the transmission region 10b can be two times of the electric field intensity of the reflection region 10a.

Based on the above, because other pattern layers provided between the first transparent electrode 104 and the second transparent electrode 109 have the same dielectric constant and the distance in the transmission region 10b and the reflection region 10a, the difference between the electric field intensity between the reflection electrode 103 and the second transparent electrode 109 and the electric field intensity between the first transparent electrode 104 and the second transparent electrode 109 is only caused by the first transparent insulation layer 105 between the reflection electrode 103 and the first transparent electrode 104. Thus, the transflective function may be achieved by selecting the thickness and dielectric constant of the first transparent insulation layer 105 so that the electric field intensity of the transmission region 10b is two times of that of the reflection region 10a.

It should be noted that firstly, based on different light sources for the reflection region 10a and the transmission region 10b, the reflection electrode 103 may be opaque, for example, a metal electrode with high reflectance, while the first transparent electrode 104 may be transparent, for example, an ITO (Indium Tin Oxide) electrode.

Secondly, each pixel unit comprises the reflection region 10a and the transmission region 10b, and in the embodiments of the present invention, the relative positions of the reflection region 10a and the transmission region 10b are not specifically defined, that is, the position of the reflection region 10a may correspond to the position of the thin film transistor 102, or the position of the transmission region 10b may correspond to the position of the thin film transistor 102.

Thirdly, the embodiments of the present invention only define the electrical connection relationship between the reflection electrode 103 and the first transparent electrode 104, and do not define the electrical connection relationship between the reflection electrode 103 and a drain electrode 1025 of the thin film transistor 102. In other words, the reflection electrode 103 and the first transparent electrode 104 may be electrically connected or disconnected with the drain electrode 1025.

Figure 1:
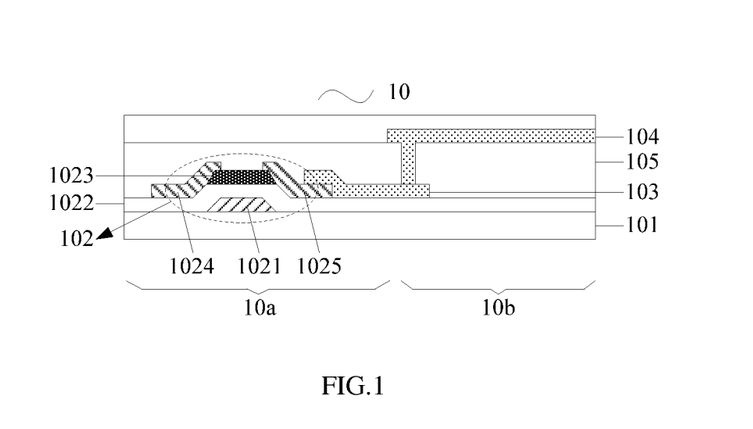
FIG. 1 is an illustrative view showing a first structure of an array substrate according to an embodiment of the present invention.
Figure 2:
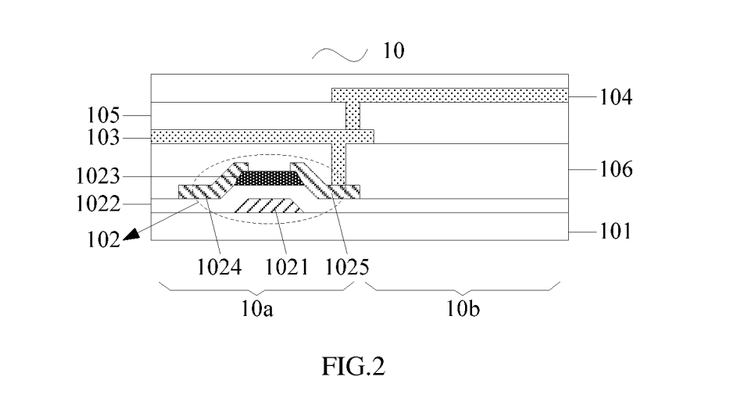
FIG. 2 is an illustrative view showing a second structure of an array substrate according to an embodiment of the present invention.
Figure 3:
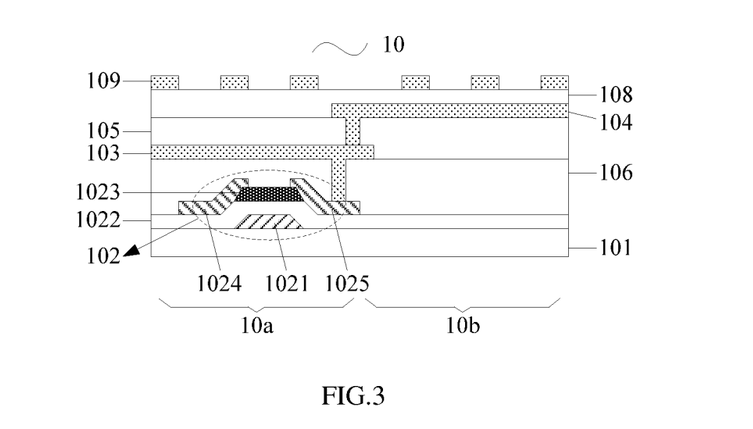
FIG. 3 is an illustrative view showing a third structure of an array substrate according to an embodiment of the present invention.

In the case that there is electrical connection between the reflection electrode 103, the first transparent electrode 104 and the drain electrode 1025, referring to FIGS. 1-3, the reflection electrode 103 and the first transparent electrode 104 may be used as the pixel electrode of the array substrate 10. In this case, the array substrate 10 or the color filter substrate may further comprise the second transparent electrode 109 used as a common electrode.

Figure 4:
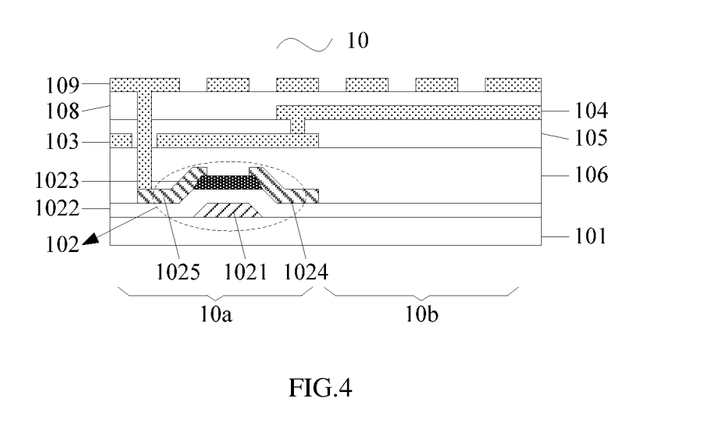
FIG. 4 is an illustrative view showing a fourth structure of an array substrate according to an embodiment of the present invention.

In the case that there is no electrical connection between the reflection electrode 103, the first transparent electrode 104 and the drain electrode 1025, referring to FIG. 4, the reflection electrode 103 and the first transparent electrode 104 may be used as the common electrode of the array substrate 10. In this case, the array substrate 10 further comprises the second transparent electrode 109 which is electrically connected with the drain electrode 1025 and is used as the pixel electrode.

Specifically, when the reflection electrode 103 and the first transparent electrode 104 are used as the common electrode of the array substrate 10 while the second transparent electrode 109 is used as the pixel electrode, since the second transparent electrode 109 is located above the reflection electrode 103 and the first transparent electrode 104, a via hole penetrating through a pattern layer between the second transparent electrode 109 and the drain electrode 1025, for instance the reflection electrode 103 and the first transparent insulation layer 105, is provided in order to electrically connect the second transparent electrode 109 and the drain electrode 1025. Herein, referring to FIG. 4, based on the equivalence between the drain electrode 1025 and a source electrode 1024 of the thin film transistor 102, the positions of the source electrode 1024 and the drain electrode 1025 may be exchanged.

In an embodiment, during electrically connecting the second transparent electrode 109 and the drain electrode 1025, a via hole having a relatively large size may be formed in the reflective electrode 103, thus, when forming the first transparent insulation layer 105, material of the insulation layer 105, such as transparent resin, may enter into the via hole in the reflection electrode 103; then, another via hole having a relatively small size may be formed in the organic transparent insulation layer 105, so that insulation between the second transparent electrode 109 and the reflection electrode 103 is ensured when the second transparent electrode 109 is electrically connected with the drain electrode 1025 by means of the via hole in the reflection electrode 103.

Fourthly, in the embodiments of the present invention, the thin film transistor 102 may be of a top-gate type or a bottom-gate type, and the type is not specifically defined here.

In the case that the thin film transistor 102 is of a bottom-gate type, the thin film transistor 102 may for example comprise in order a gate electrode 1021, a gate insulation layer 1022, a semi-conductive active layer 1023, and the source electrode 1024 and the drain electrode 1025. Referring to FIG. 1, the reflection electrode 103 may be in direct contact with the drain electrode 1025 in a manner of lapping so as to achieve electric connection; or referring to FIG. 2, the reflection electrode 103 may be electrically connected with the drain electrode 1025 by means of a via hole within a pattern layer between the reflection electrode 103 and the drain electrode 1025. Here, the specific connection manner between the reflection electrode 103 and the drain electrode 1025 may be designed according to the actual structure of the array substrate.

In the case that the thin film transistor 102 is of a top-gate type, the thin film transistor 102 may for example comprise in order the semi-conductive active layer 1023, the source electrode 1024 and the drain electrode 1025, the gate insulation layer 1022, and the gate electrode 1021. In this case, since the source electrode 1024 and the drain electrode 1025 are below the gate insulation layer 1022, and the reflection electrode 103 needs to be electrically connected with the drain electrode 1025, the gate insulation layer 1022 should comprise a via hole for electrically connecting the reflection electrode 103 with the drain electrode 1025.

Considering simplification of manufacturing process, in a further embodiment of the present invention, the thin film transistor 102 is of a bottom-gate type in an embodiment of the present invention.

The embodiments of the present invention provide an array substrate 10, comprising a plurality of pixel units arranged in an array, each pixel unit comprising a reflection region 10a and a transmission region 10b, and for any pixel unit, the array substrate comprises a substrate 101; a thin film transistor 102 provided on the substrate 101; and a reflection electrode 103 and a first transparent electrode 104 which are electrically connected with each other. The first transparent insulation layer 105 is further provided between the reflection electrode 103 and the first transparent electrode 104, and the reflection electrode 103 is on a side of the first transparent insulation layer 105 which is closer to the substrate 101. The reflection electrode 103 is located in the reflection region 10a, and the first transparent electrode is located in the transmission region 10b.

In the embodiments of the present invention, the reflection electrode 103 is provided in the reflection region 10a, the first transparent electrode 104 is provided in the transmission region 10b, and the reflection electrode 103 and the first transparent electrode 104 are arranged in different layers (the reflection electrode 103 is closer to the substrate 101, and the first transparent electrode 104 is away from the substrate 101), such that a first distance between the reflection electrode 103 in the reflection region 10a and the second transparent electrode 109 is greater than a second distance between the first transparent electrode 104 in the transmission region 10b and the second transparent electrode 109. Based on the above, since the difference between the first distance and the second distance caused by the first transparent insulation layer 105 between the reflection electrode 103 and the first transparent electrode 104, the electric field intensity of the transmission region 10b may be two times of the electric field intensity of the reflection region 10a by controlling (selecting) the dielectric constant and the thickness of the first transparent insulation layer 105 in the case that the voltage between the reflection electrode 103 and the second transparent electrode 109 is equal to the voltage between the first transparent electrode 104 and the second transparent electrode 109, so that the phase delay of the liquid crystal in the transmission region 10b is two times of the phase delay of the liquid crystal in the reflection region 10a. Thus, when the array substrate 10 is applied to a liquid crystal display panel, images may be displayed by transmitted light from the back light source under a dim environment, and by reflected light from the ambient under a bright environment. In this case, energy consumption is reduced and light utilization rate is increased.

It is mentioned above that the positions of the reflection region 10a and the transmission region 10b may be exchanged. However, when considering that the reflection region 10a is opaque, and that the region where the thin film transistor 102 is located is also opaque, in an embodiment of the present invention, the position of the reflection region 10a corresponds to the position of the thin film transistor 102, which may increase aperture rate of the liquid crystal display panel.

Considering the first transparent insulation layer 105 is provided between the reflection electrode 103 and the first transparent electrode 104, and in order to electrically connect the reflection electrode 103 with the first transparent electrode 104, alternatively, referring to FIGS. 1-4, the first transparent electrode 104 may be electrically connected with the reflection electrode 103 by a via hole provided in the first transparent insulation layer 105.

Further, referring to FIGS. 1-3, the reflection electrode 103 and the first transparent electrode 104 may be electrically connected with the drain electrode 1025 of the thin film transistor 102. In this case, the reflection electrode 103 and the first transparent electrode 104 may be used as the pixel electrode of the array substrate 10.

Here, each of the reflection electrode 103 and the first transparent electrode 104 may be a plate electrode.

As mentioned above, the electric connection manner between the reflection electrode 103 and the drain electrode 1025 may comprise the direct lapping manner shown in FIG. 1 and the via hole connection manner shown in FIG. 2. Alternatively, the array substrate 10 may further comprise a second transparent insulation layer 106 provided between the thin film transistor 102 and the reflection electrode 103, the second transparent insulation layer 106 may be an organic transparent insulation layer. The reflection electrode 103 may be electrically connected with the drain electrode 1025 by a via hole provided in the second transparent insulation layer 106.

With the second transparent insulation layer 106, the flatness of the array substrate 10 is improved, and parasitic capacitance between the first transparent electrode 104 and the data line on the array substrate 10 is reduced.

For a thin film transistor of a bottom-gate type, it may comprise in order the gate electrode 1021, the gate insulation layer 1022, the semi-conductive active layer 1023, and the source electrode 1024 and the drain electrode 1025 which are provided on the substrate 101. In this case, when the second transparent insulation layer 106 is directly provided above the source electrode 1024 and the drain electrode 1025, poor bonding may be caused by poor adhesion between the material of the organic transparent insulation layer 106, such as resin material, and the material of the source electrode 1024 and the drain electrode 1025, such as metal material. Considering this, referring to FIG. 5, the array substrate 10 may comprise an adhesion layer 107 provided between the source electrode 1024 and the drain electrode 1025 of the thin film transistor 102 and the second transparent insulation layer 106.

The adhesion layer 107 is used to increase bonding strength between the second transparent insulation layer 106 and the source/drain metal layer, and it may be made of the same material as the passivation layer, such as SiNx, SiOx, SiOxNy or the like.

Further, in order to avoid adverse effect on the transmission rate of the liquid crystal display panel, in a further embodiment of the present invention, the first transparent insulation layer 105 and the second transparent insulation layer 106 are transparent resin layers with high transmission rate.

The material of the transparent resin layer may be one of polyimide resin and acrylic resin.

The transparent resin layer here not only has high transmission rate, and has a greater thickness, so that adjustment of the distance between the reflection electrode 103 and the second transparent electrode 109 may be achieved by adjusting the thickness of the transparent resin layer.

When the array substrate 10 comprises, on the substrate 101, the thin film transistor 102, the reflection electrode 103 and the first transparent electrode 104 electrically connected with the drain electrode 1025 of the thin film transistor 102, the first transparent insulation layer 105 between the reflection electrode 103 and the first transparent electrode 104, and the second transparent insulation layer 106 between the thin film transistor 102 and the reflection electrode 103, the array substrate 10 is a TN (Twitst Nematic) array substrate. However, with variation of the view angle, a gray scale inversion may be caused in a TN array substrate due to the characteristics of the TN array substrate, and such inversion makes view angle range narrower.

Figure 5:
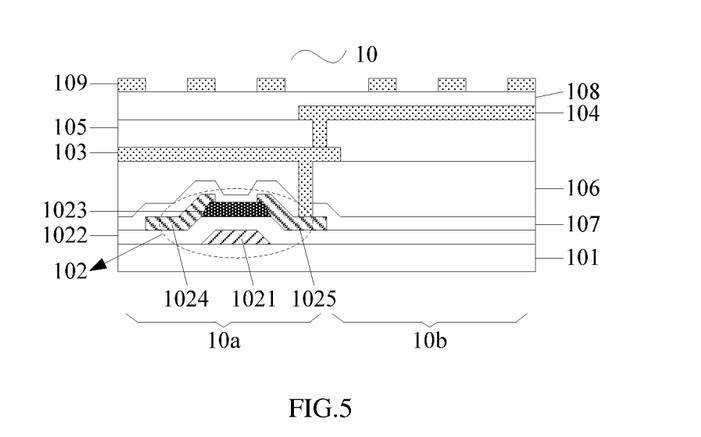
FIG. 5 is an illustrative view showing a fifth structure of an array substrate according to an embodiment of the present invention.

Considering the above, referring to FIGS. 3-5, the array substrate 10 according to a further embodiment of the present invention further comprises in order a passivation layer 108 and the second transparent electrode 109 provided on the first transparent electrode 104. In the case that the reflection electrode 103 and the first transparent electrode 104 are not electrically connected with the drain electrode 1025 of the thin film transistor 102, the second transparent electrode 109 may be electrically connected with the drain electrode 1025.

The second transparent electrode 109 may comprise a plurality of strip electrodes which are electrically connected.

In the case that the reflection electrode 103 and the first transparent electrode 104 are electrically connected with the drain electrode 1025 of the thin film transistor 102, the reflection electrode 103 and the first transparent electrode 104 may be used as the pixel electrode, and the second transparent electrode 109 may be used as the common electrode.

In the case that the reflection electrode 103 and the first transparent electrode 104 are not electrically connected with the drain electrode 1025 of the thin film transistor 102, the second transparent electrode 109 is electrically connected with the drain electrode 1025 and may be used as the pixel electrode, and the reflection electrode 103 and the first transparent electrode 104 may be used as the common electrode.

Thus, the array substrate 10 is an ADS (Advanced Super Dimensional Switching) array substrate. For the ADS array substrate, both the second transparent electrode 109 and the reflection electrode 103 or the first transparent electrode 104 are provided on the array substrate 10, and a multi-dimensional electric field is formed by electric field produced by edges of strip electrodes in the same plane, and electric field produced between the strip electrode layer and the plate electrode, with the multi-dimensional electric field, all alignment liquid crystal molecules within the liquid crystal cell between the strip electrodes, as well as above the electrodes, are rotated, and therefore, working efficiency of liquid crystals is improved, and the transmission rate is increased. ADS technique may improve image quality of a display panel, and has the advantages of high resolution, high transmission rate, low power consumption, wide view angle, high aperture rate, low aberration, no push Mura and the like.

Figure 6:
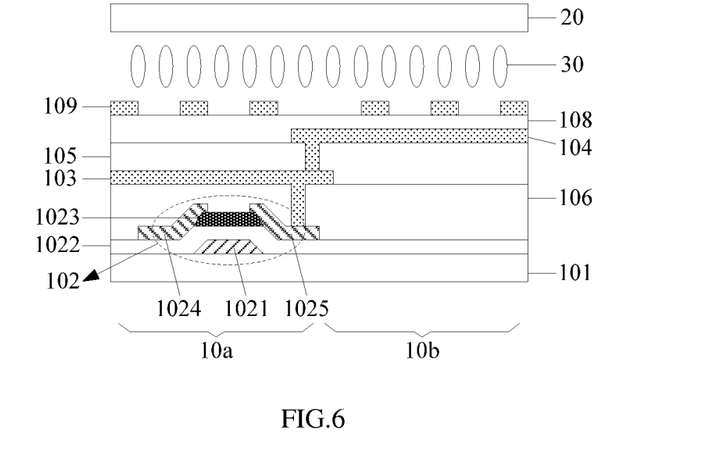
FIG. 6 is an illustrative view showing a first structure of a LCD panel according to an exemplary embodiment of the present invention.
Figure 7:
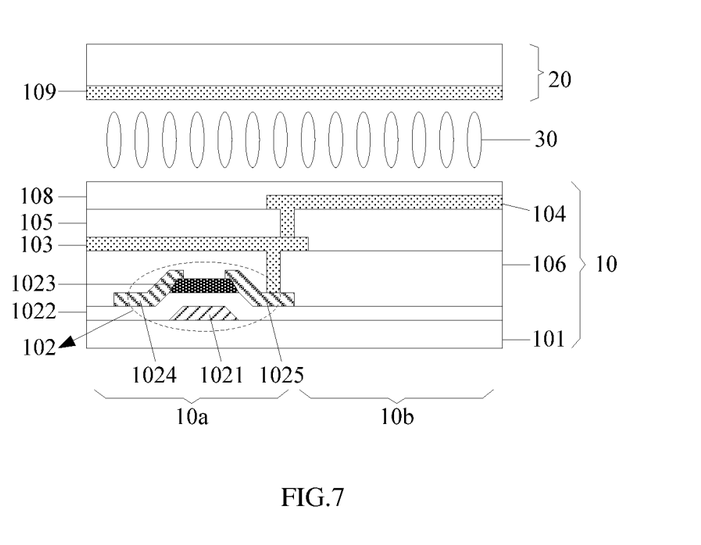
FIG. 7 is an illustrative view showing a second structure of a LCD panel according to an exemplary embodiment of the present invention.

The embodiments of the present invention provide a liquid crystal display panel, as shown in FIGS. 6-7, the liquid crystal display panel comprises the above array substrate 10 and a color filter substrate 20 which are celled together; and a liquid crystal layer 30 located between the array substrate and the color filter substrate.

When the liquid crystal display panel is of a TN type, referring to FIG. 7, the array substrate only comprises the reflection electrode 103 and the first transparent electrode 104, and the color filter substrate 20 comprises the second transparent electrode 109, wherein the second transparent electrode 109 may be a plate electrode.

When the liquid crystal display panel is of an ADS type, referring to FIG. 6, the array substrate 10 comprises the reflection electrode 103, the first transparent electrode 104, and the second transparent electrode 109, wherein the second transparent electrode 109 comprises a plurality of strip electrodes which are electrically connected.

It is known from the above description that the distance between the reflection electrode 103 and the second transparent electrode 109 is different from that between the first transparent electrode 104 and the second transparent electrode 109, wherein the dielectric layer between the reflection electrode 103 and the second transparent electrode 109 comprises the first transparent insulation layer 105, the passivation layer 108, and the liquid crystal layer 30, and the dielectric layer between the first transparent electrode 104 and the second transparent electrode 109 comprises the passivation layer 108 and the liquid crystal layer 30.

According to the relationship between voltage and electric field intensity, that is, $U=\epsilon_0 \epsilon ED$, when the dielectric layer comprises several dielectrics, as shown in FIG. 7, the voltage of the reflection region 10a may be expressed as following formula: $U=\epsilon_0 (\epsilon_P E_2 D_P + \epsilon_L E_2 D_L + \epsilon_R E_2 D_R)$, and the voltage of the transmission region 10b may be expressed as following formula: $U=\epsilon_0 (\epsilon_P E_1 D_P + \epsilon_L E_1 D_L)$, wherein $\epsilon_0$ is vacuum permittivity, $\epsilon_P$ is the dielectric constant of the passivation layer 108, $\epsilon_L$ is the dielectric constant of the liquid crystal layer, $\epsilon_R$ is the dielectric constant of the first transparent insulation layer, $D_P$ is the thickness of the passivation layer 108, $D_L$ is the thickness of the liquid crystal layer, $D_R$ is the thickness of the first transparent insulation layer, U is the voltage between the two electrodes, $E_1$ is the electric field intensity of the transmission region 10b, and $E_2$ is the electric field intensity of the reflection region 10a.

When obtaining a transflective display, there is the following relationship: $E_1=2E_2$. Therefore, with the same voltage, the following formula may be deduced: $\epsilon_R D_R = \epsilon_P D_P + \epsilon_L D_L$. Thus, after the liquid crystal layer 30 and the passivation layer 108 are determined, the thickness of the first transparent insulation layer 105 may be set according to its material.

Correspondingly, as shown in FIG. 6, the voltage of the reflection region 10a may be expressed as following formula: $U=\epsilon_0 (\epsilon_P E_2 D_P + \epsilon_R E_2 D_R)$, and the voltage of the transmission region 10b may be expressed as following formula: $U=\epsilon_0 \epsilon_P E_1 D_P$, wherein $\epsilon_0$ is vacuum permittivity, $\epsilon_P$ is the dielectric constant of the passivation layer 108, $\epsilon_R$ is the dielectric constant of the first transparent insulation layer, $D_P$ is the thickness of the passivation layer 108, $D_R$ is the thickness of the first transparent insulation layer, U is the voltage between the two electrodes, $E_1$ is the electric field intensity of the transmission region 10b, and $E_2$ is the electric field intensity of the reflection region 10a.

When obtaining a transflective display, there is the following relationship: $E_1=2E_2$. Therefore, with the same voltage, the following formula may be deduced: $\epsilon_R D_R = \epsilon_P D_P$. Thus, after the passivation layer 108 is determined, the thickness of the first transparent insulation layer 105 may be set according to its material.

Here, the material of the passivation layer 108 may comprise SiNx, SiOx, SiOxNy or the like, and has a relatively high dielectric constant. For example, the dielectric constant of SiNx is usually in a range of 6.5-6.8. The material of the first transparent insulation layer 105 may comprise transparent resin, for example, one of polyimide resin and acrylic resin. The transparent resin has a relatively low dielectric constant, usually in a range of 3-4.

Figure 8:
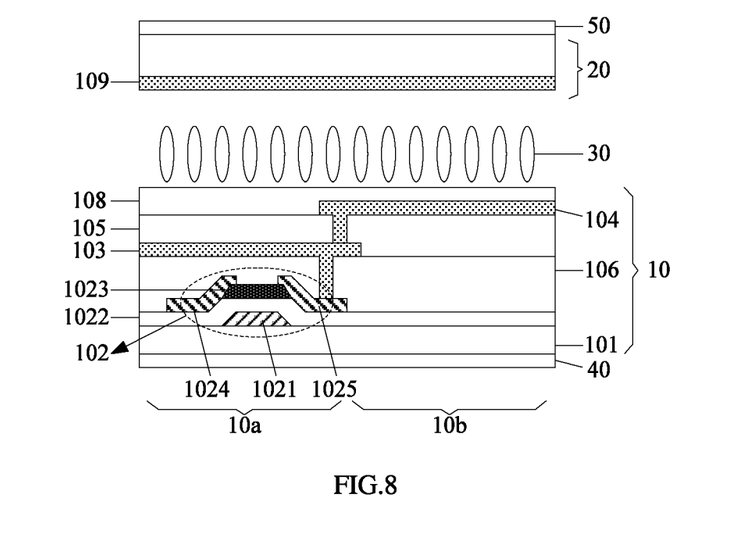
FIG. 8 is an illustrative view showing a third structure of a LCD panel according to an exemplary embodiment of the present invention.

Further, as shown in FIG. 8, the liquid crystal display panel may further comprise a first polarizer 40 provided on a side of the array substrate 10 facing away from the liquid crystal layer 30, the first polarizer 40 comprising a built-in first λ/4 phase delay film; and a second polarizer 50 provided on a side of the color filter substrate 20 facing away from the liquid crystal layer 30, the second polarizer 50 comprising a built-in second λ/4 phase delay film, wherein transmission axis of the first polarizer 40 is perpendicular to that of the second polarizer 50.

Figure 9:
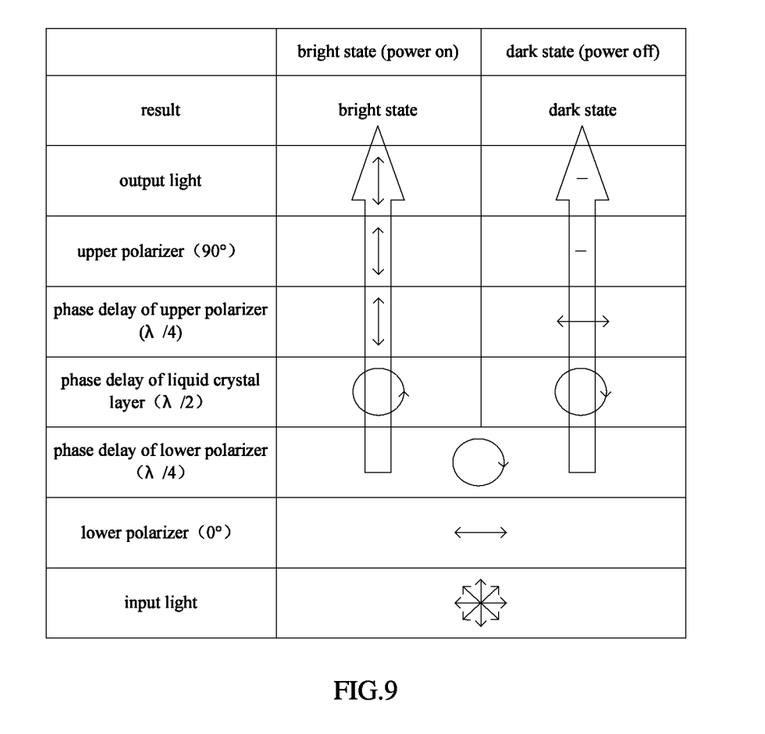
FIG. 9 is an illustrative view showing bright state and dark state of the transmission region of the LCD panel according to an embodiment of the present invention.

Principle of bright state display and dark state display of the liquid crystal display panel will be described next by taking the liquid crystal display panel which comprises an ADS array substrate as an example, and in the liquid crystal display panel, the polarization direction of the first polarizer 40 is in the horizontal direction (0° polarizer), and the polarization direction of the second polarizer 50 is in the vertical direction (90° polarizer). FIG. 9 is an illustrative view showing bright state and dark state of the transmission region 10b; and FIG. 10 is an illustrative view showing bright state and dark state of the reflection region 10a.

Figure 10:
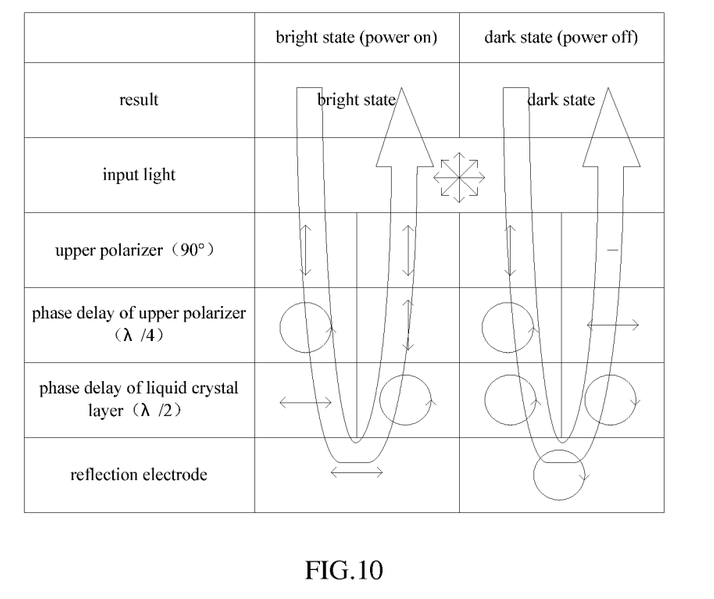
FIG. 10 is an illustrative view showing bright state and dark state of the reflection region of the LCD panel according to an embodiment of the present invention.

On one hand, when voltage is not applied to the liquid crystal display panel, the reflection region 10a and the transmission region 10b represent a dark state, and specific light simulation is shown in the dim columns in FIGS. 9-10.

In the reflection region 10a, outside ambient light is natural light. After the outside ambient light passes through the second polarizer 50 (for example, 90° polarizer), a linearly polarized light whose polarizing direction is parallel to the transmission axis of the second polarizer 50 is produced, and after the linearly polarized light passes through the second λ/4 phase delay film, a left circularly polarized light is produced; when the left circularly polarized light passes through the liquid crystal layer 30, the liquid crystal molecules in the liquid crystal layer 30 does not have delay effect on it because no electric field is applied to the liquid crystal molecules in the liquid crystal layer 30; then the left circularly polarized light enters into the reflection electrode 103, and after λ/2 phase delay of the reflection electrode 103, changes into a right circularly polarized light, the right circularly polarized light enters into the liquid crystal layer 30 again with no delay therein, and after passing through the second λ/4 phase delay film, is changed into a linearly polarized light whose polarizing direction is perpendicular to the transmission axis of the second polarizer 50 and thus cannot emit out of the second polarizer 50. Therefore, the reflection region 10a is in a dark state.

In the transmission region 10b, the light from the back light source is similar to the natural light. After the light from the back light source passes through the first polarizer 40 (for example, 0° polarizer), a linearly polarized light whose polarizing direction is parallel to the transmission axis of the first polarizer 40 is produced, and after the linearly polarized light passes through the first λ/4 phase delay film, a right circularly polarized light is produced; when the right circularly polarized light passes through the liquid crystal layer 30, the liquid crystal molecules in the liquid crystal layer 30 does not have delay effect on it because no electric field is applied to the liquid crystal molecules in the liquid crystal layer 30; then the right circularly polarized light enters into the second λ/4 phase delay film, and changes into a linearly polarized light whose polarizing direction is perpendicular to the transmission axis of the second polarizer 50 and thus cannot emit out of the second polarizer 50. Therefore, the transmission region 10b is in a dark state.

It should be noted that in the liquid crystal display panel according to the embodiments of the present invention, the first λ/4 phase delay film is combined in the first polarizer 40, that is, the first λ/4 phase delay film is a portion of the first polarizer 40; and the second λ/4 phase delay film is combined in the second polarizer 50, that is, the second λ/4 phase delay film is a portion of the second polarizer 50. However, in order to clearly describe the operation process of the embodiments of the present invention, the λ/4 phase delay film and the polarizer are described separately according to the different effects on the light. Obviously, in the embodiments of the present invention, the λ/4 phase delay film and the polarizer may be provided separately.

On the other hand, when voltage is applied to the liquid crystal display panel, the reflection region 10a and the transmission region 10b are in bright state, and specific light simulation is shown in the bright columns in FIGS. 9-10.

In the reflection region 10a, after the outside ambient light passes through the second polarizer 50, a linearly polarized light whose polarizing direction is parallel to the transmission axis of the second polarizer 50 is produced, and after the linearly polarized light passes through the second λ/4 phase delay film, a left circularly polarized light is produced; when the left circularly polarized light passes through the liquid crystal layer 30, the liquid crystal molecules in the liquid crystal layer 30 have delay effect on it and the left circularly polarized light is changed into a linearly polarized light whose polarizing direction is perpendicular to the transmission axis of the second polarizer 50; then the linearly polarized light enters into the reflection electrode 103, and after λ/2 phase delay of the reflection electrode 103, remains the linearly polarized light whose polarizing direction is perpendicular to the transmission axis of the second polarizer 50; the linearly polarized light, after again entering into the liquid crystal layer 30 and being delayed, changes into a right circularly polarized light which, after passing through the second λ/4 phase delay film, is changed into a linearly polarized light whose polarizing direction is parallel to the transmission axis of the second polarizer 50 and thus can emit out of the second polarizer 50. Therefore, the reflection region 10a is in a bright state.

In the transmission region 10b, after the light from the back light source passes through the first polarizer 40, a linearly polarized light whose polarizing direction is parallel to the transmission axis of the first polarizer 40 is produced, and after the linearly polarized light passes through the first λ/4 phase delay film, a right circularly polarized light is produced; when the right circularly polarized light passes through the liquid crystal layer 30, the liquid crystal molecules in the liquid crystal layer 30 have delay effect on it and the right circularly polarized light is changed into a left circularly polarized light; then the left circularly polarized light enters into the second λ/4 phase delay film, and changes into a linearly polarized light whose polarizing direction is parallel to the transmission axis of the second polarizer 50 and thus can emit out of the second polarizer 50. Therefore, the transmission region 10b is in a bright state.

Based on the above, alternatively, the thickness of liquid crystal layer in the transmission region 10b of the array substrate 10 is equal to the thickness of liquid crystal layer in the reflection region 10a of the array substrate 10.

Thus, since the thickness of the liquid crystal layer of the whole liquid crystal display panel is the same, the manufacturing process may be simplified, and the process difficulty is lowered.

It should be noted that in the embodiments of the present invention, the description takes the case in which the thickness of liquid crystal layer in the transmission region 10b is equal to the thickness of liquid crystal layer in the reflection region 10a as an example; however, the present invention is not limited to this. In other words, the thickness of liquid crystal layer in the transmission region 10b may be different from the thickness of liquid crystal layer in the reflection region 10a. In this case, the thickness of the liquid crystal layers only needs to be set according to the relationship between the voltage and the electric field intensity under the condition of a plurality of dielectrics.

The embodiments of the present invention also provide a method for manufacturing an array substrate 10, referring to FIGS. 1-4, the array substrate comprising a plurality of pixel units arranged in an array, each pixel unit comprising a reflection region 10a and a transmission region 10b, wherein for any pixel unit, the method comprises steps of: forming on a substrate 101 a thin film transistor 102, a reflection electrode 103 and a first transparent electrode 104 which are electrically connected with each other, and a first transparent insulation layer 105 between the reflection electrode 103 and the first transparent electrode 104, wherein the reflection electrode 103 is located below the first transparent insulation layer 105, the first transparent electrode 104 is located above the first transparent insulation layer 105, the reflection electrode 103 is in the reflection region 10a, and the first transparent electrode 104 is in the transmission region 10b.

It should be noted that the above or upper and below or lower mentioned in the disclosure is relative to the order of the manufacturing process, specifically, during manufacturing the array substrate 10, the layer formed first is at a lower position (below), and the layer formed later is at an upper position (above).

In addition, considering the aperture rate of the liquid crystal display panel, in a further embodiment of the present invention, the reflection region 10a is formed at a position corresponding to the thin film transistor 102.

Further alternatively, the first transparent electrode 104 may be electrically connected with the reflection electrode 103 by a via hole formed in the first transparent insulation layer 105.

When forming the reflection electrode 103 and the first transparent electrode 104 which are electrically connected with each other and forming the first transparent insulation layer 105 located between the reflection electrode 103 and the first transparent electrode 104, a metal layer may be deposited to the substrate on which the thin film transistor 102 has been formed, and a metal electrode, that is, the reflection electrode 103, is formed in the reflection region 10a through one-time patterning process; the first transparent insulation layer 105 with a via hole is formed through one-time patterning process on the substrate on which the reflection electrode 103 has been formed; an ITO layer is deposited to the substrate on which the first transparent insulation layer 105 has been formed, and an ITO electrode, that is, the first transparent electrode 104, is formed in the transmission region 10b through one-time patterning process. The reflection electrode 103 and the first transparent electrode 104 may be electrically connected by a via hole formed in the first transparent insulation layer 105.

Further, when forming the array substrate 10, the reflection electrode 103 and the first transparent electrode 104 may be electrically connected with the drain electrode 1025 of the thin film transistor 102. Thus, the reflection electrode 103 and the first transparent electrode 104 may be used as the pixel electrode of the array substrate 10.

Since the first transparent electrode 104 is electrically connected with the reflection electrode 103 by a via hole formed in the first transparent insulation layer 105, the electric connection between the reflection electrode 103, the first transparent electrode 104 and the drain electrode 1025 of the thin film transistor 102 may be obtained simply by electrically connecting the reflection electrode 103 with the drain electrode 1025.

The electric connection manner between the reflection electrode 103 and the drain electrode 1025 may be the lapping manner shown in FIG. 1 or the via hole connection manner shown in FIG. 2.

Based on the above, referring to FIG. 2, the method further comprises forming a second transparent insulation layer 106 between the thin film transistor 102 and the reflection electrode 103, wherein the reflection electrode 103 is electrically connected with the drain electrode 1025 by a via hole formed in the second transparent insulation layer 106.

With the second transparent insulation layer 106, the flatness of the array substrate 10 is improved, and parasitic capacitance between the first transparent electrode 104 and the data line on the array substrate 10 is reduced.

In a further embodiment of the present invention, the first and second transparent insulation layers 105 and 106 are transparent resin layers with high transmission rate. The material of the transparent resin layer may be one of polyimide resin and acrylic resin.

Since the second transparent insulation layer 106 is directly formed above the source electrode 1024 and the drain electrode 1025, poor bonding may be caused. Considering this, as shown in FIG. 5, an adhesion layer 107 is provided between the source electrode 1024 and the drain electrode 1025 of the thin film transistor 102 and the second transparent insulation layer 106, so as to increase the bonding strength of the second transparent insulation layer 106 and the source/drain metal layer. The adhesion layer 107 may be made of the same material as the passivation layer, such as SiNx, SiOx, SiOxNy or the like.

Based on the above, a TN array substrate is formed. However, the view angle range of the TN array substrate is narrow, and a gray scale inversion may be caused with the changing of the view angle range. Thus, the passivation layer 108 and the second transparent electrode 109 may be formed in order above the first transparent electrode 104. In the case that the reflection electrode 103 and the first transparent electrode 104 are not electrically connected with the drain electrode 1025 of the thin film transistor 102, the second transparent electrode 109 is electrically connected with the drain electrode 1025. Thus, an ADS array substrate is formed. The ADS array substrate has the advantages of high resolution, high transmission rate, low power consumption, wide view angle, high aperture rate, low aberration, no push Mura and the like.

Here, the second transparent electrode 109 may comprise a plurality of strip electrodes which are electrically connected.

The above is only for illustrating the specific embodiments of the present invention, and the scopes of the present invention are not limited to this. Various changes or modifications which are made by those skilled in the art within the technical disclosure of the present invention all fall within the scopes of the present invention. The scopes of the present invention are defined in the claims and their equivalents.

What is claimed is:

1. An array substrate comprising:
a plurality of pixel units arranged in an array, each pixel unit comprising a reflection region and a transmission region, and
for any pixel unit, the array substrate comprising a substrate; a thin film transistor provided on the substrate; and a reflection electrode; and
a first transparent electrode, the reflection electrode being located in the reflection region, and the first transparent electrode being located in the transmission region,
wherein
a first transparent insulation layer is provided between the reflection electrode and the first transparent electrode, the position of the reflection region corresponds to that of the thin film transistor and the reflection electrode is on a side of the first transparent insulation layer which is closer to the substrate such that the reflection electrode at least covers over the whole thin film transistor,
wherein the array substrate further comprises a passivation layer provided above the first electrode and a second transparent electrode provided on the passivation layer, and
wherein the reflection electrode and the first transparent electrode are electrically connected with each other but not electrically connected with the drain electrode of the thin film transistor, while the second transparent electrode is electrically connected with the drain electrode.

2. The array substrate of claim 1 further comprising a second transparent insulation layer provided between the thin film transistor and the reflection electrode.

3. The array substrate of claim 2, further comprising an adhesion layer provided between the second transparent insulation layer and source and drain electrodes of the thin film transistor.

4. The array substrate of claim 1, wherein the second transparent electrode is electrically connected with the drain electrode by a via hole penetrating through the reflection electrode and the first transparent insulation layer.

5. The array substrate of claim 1, wherein the second transparent electrode comprises a plurality of strip electrodes which are electrically connected.

6. The array substrate of claim 1, wherein the following formula is satisfied: $\in_R D_R = \in_p D_p$, wherein $\in_p$ is the dielectric constant of the passivation layer, $\in_R$ is the dielectric constant of the first transparent insulation layer, $D_P$ is the thickness of the passivation layer, and $D_R$ is the thickness of the first transparent insulation layer.

7. A liquid crystal display panel comprising:
an array substrate and a color filter substrate which are celled together; and
a liquid crystal layer located between the array substrate and the color filter substrate, wherein
the array substrate is the array substrate according to claim 1.

8. The liquid crystal display panel of claim 7, wherein the thickness of liquid crystal layer in the transmission region of the array substrate is equal to the thickness of liquid crystal layer in the reflection region of the array substrate;
the array substrate further comprises a passivation layer provided above the first transparent electrode;
a second transparent electrode is provided on a side of the color filter substrate facing the liquid crystal layer,
wherein the following formula is satisfied: $\in_R D_R = \in_p D_p + \in_L D_L$, wherein $\in_p$ is the dielectric constant of the passivation layer, $\in_L$ is the dielectric constant of the liquid crystal layer, $\in_R$ is the dielectric constant of the first transparent insulation layer, $D_P$ is the thickness of the passivation layer, $D_L$ is the thickness of the liquid crystal layer, $D_R$ is the thickness of the first transparent insulation layer.

9. The liquid crystal display panel of claim 7, wherein the thickness of liquid crystal layer in the transmission region of the array substrate is equal to the thickness of liquid crystal layer in the reflection region of the array substrate;

wherein the following formula is satisfied: $\in_R D_R = \in_p D_p$, wherein $\in_p$ is the dielectric constant of the passivation layer, $\in_R$ is the dielectric constant of the first transparent insulation layer, $D_p$ is the thickness of the passivation layer, and $D_R$ is the thickness of the first transparent insulation layer.

10. A method for manufacturing an array substrate, the array substrate comprising a plurality of pixel units arranged in an array, each pixel unit comprising a reflection region and a transmission region, wherein for any pixel unit, the method comprises steps of:

forming a thin film transistor on a substrate;

forming a reflection electrode in the reflection region such that the reflection electrode at least covers over the whole thin film transistor, the position of the reflection region corresponding to that of the thin film transistor;

forming a first transparent insulation layer above the reflection electrode;

forming a first transparent electrode above the first transparent insulation layer, wherein the first transparent electrode the reflection electrode are electrically connected with each other but not electrically connected with a drain electrode of the thin film transistor;

forming in order a passivation layer and second transparent electrode on the first transparent electrode; and electrically connecting the second transparent electrode with the drain electrode.

11. The method of claim 10, further comprising step of:

forming a via hole in the first transparent insulation layer, wherein the first transparent electrode is electrically connected with the reflection electrode by the via hole.

12. The method of claim 10, wherein forming a second transparent insulation layer between the thin film transistor and the reflection electrode.

13. The method of claim 10, wherein the thickness of liquid crystal layer in the transmission region of the array substrate is equal to the thickness of liquid crystal layer in the reflection region of the array substrate;

the method further comprises step of selecting dielectric constant and the thickness of the first transparent insulation layer so that electric field intensity of the transmission region is two times of electric field intensity of the reflection region in the case that a voltage between the reflection electrode and the second transparent electrode is equal to a voltage between the first transparent electrode and the second transparent electrode.

14. The method of claim 13, wherein the thickness of liquid crystal layer in the transmission region of the array substrate is equal to the thickness of liquid crystal layer in the reflection region of the array substrate;

the method further comprises step of selecting thickness $D_R$ of the first transparent insulation layer so that the following formula is satisfied: $\in_R D_R = \in_p D_p$, wherein $\in_p$ is the dielectric constant of the passivation layer, $\in_R$ is the dielectric constant of the first transparent insulation layer, $D_p$ is the thickness of the passivation layer.

15. The liquid crystal display panel of claim 7, wherein electric field intensity of the transmission region of the array substrate is two times of electric field intensity of the reflection region of the array substrate.

16. The liquid crystal display panel of claim 15, wherein the thickness of liquid crystal layer in the transmission region of the array substrate is equal to the thickness of liquid crystal layer in the reflection region of the array substrate.

17. The liquid crystal display panel of any one of claims 7, further comprising a first polarizer provided on a side of the array substrate facing away from the liquid crystal layer, the first polarizer comprising a built-in first λ/4 phase delay film; and a second polarizer provided on a side of the color filter substrate facing away from the liquid crystal layer, the second polarizer comprising a built-in second λ/4 phase delay film, wherein transmission axis of the first polarizer is perpendicular to that of the second polarizer.

* * * * *